United States Patent
Bansal

[19]

[11] Patent Number: 5,858,817
[45] Date of Patent: Jan. 12, 1999

[54] PROCESS TO PERSONALIZE MASTER SLICE WAFERS AND FABRICATE HIGH DENSITY VLSI COMPONENTS WITH A SINGLE MASKING STEP

[75] Inventor: Jai P. Bansal, Manassas, Va.

[73] Assignee: Lockheed Martin Corporation, Bethesda, Md.

[21] Appl. No.: 728,880

[22] Filed: Oct. 10, 1996

[51] Int. Cl.⁶ .................................................. H01L 21/70
[52] U.S. Cl. .......................................... 438/129; 438/599
[58] Field of Search .................................. 438/622, 618, 438/587, 129, 599

[56] References Cited

U.S. PATENT DOCUMENTS

| | | | |
|---|---|---|---|
| 4,249,193 | 2/1981 | Balyoz et al. ........................... | 257/185 |
| 4,295,149 | 10/1981 | Balyoz et al. ............................ | 257/90 |
| 4,500,906 | 2/1985 | Ohno et al. . | |
| 4,623,911 | 11/1986 | Pryor . | |
| 4,893,170 | 1/1990 | Tokuda et al. . | |
| 4,943,841 | 7/1990 | Yahara . | |
| 5,023,701 | 6/1991 | Sharpe-Geisler . | |
| 5,073,729 | 12/1991 | Greene et al. . | |
| 5,083,181 | 1/1992 | Yoshida et al. . | |
| 5,084,404 | 1/1992 | Sharp-Geisler . | |
| 5,132,571 | 7/1992 | McCollum et al. . | |
| 5,185,283 | 2/1993 | Fukui et al. . | |
| 5,459,093 | 10/1995 | Kuroda et al. .......................... | 438/622 |

OTHER PUBLICATIONS

Wolf, Silicon processing for the VLSI era, vol. 2, pp. 276–286, 1990.

*Primary Examiner*—Jey Tsai
*Attorney, Agent, or Firm*—Lane, Aitken & McCann

[57] ABSTRACT

A method of making gate array ASIC components from a master slice wafer having a first conducting layer containing logic elements, a second conducting layer containing first electrically conducting elements extending in a first direction, and a third conducting layer comprises interconnecting at least some of the logic elements to one another with a single masking process step by defining, on the third conducting layer, second conducting elements connected to the first electrically conducting elements to define connections between the logic elements.

16 Claims, 9 Drawing Sheets

PROCESS TO PERSONALIZE MASTER SLICE WAFERS AND FABRICATE HIGH DENSITY VLSI COMPONENTS WITH A SINGLE MASKING STEP

FIELD OF THE INVENTION

The present invention relates to a method of designing and fabricating high density, high-performance gate array application specified integrated circuit (ASIC) components from master slice wafers with a single masking process step.

DESCRIPTION OF THE PRIOR ART

At the present, three of the most commonly used categories of ASIC component design methodologies are: 1) standard cell ASICs, 2) gate array cell ASICs and 3) field programmable gate array ASICS. Standard cell ASICs provide maximum circuit density per unit chip area and the highest performance components. ASIC components in this category require all unique masking process steps and, hence, the fabricating process takes a very long time and the process is expensive.

Gate array ASICs are fabricated using previously partially processed wafers, master slice wafers, which still require several masking steps for interconnecting the transistors to make up logic circuit cells and interconnecting the cells to complete the ASIC function. This method of fabricating ASICs also takes several unique processing steps and several days to complete the process.

Field programmable gate array (FPGA) components can be processed by electronically reprogramming the function in the components or with an antifuse technology process. Circuit interconnections are formed in generic FPGA components to achieve required ASIC function. FPGA components can be produced without a semiconductor foundry, but circuit density achievable per unit chip area is less than 10% of the circuit density of the ASICs produced in the other two categories. The FPGA components are also expensive on a cost per circuit basis and would require many more modules to do the system function, hence increasing the system package size. Performance of the FPGA components is much lower than that of the other two categories of components due to high antifuse contact resistance or other active devices used to make interconnections.

SUMMARY OF THE INVENTION

In accordance with the present invention, the masking step used to implement the function of a unique ASIC component also implements higher level core logic functions from basic logic elements in a multi-function logic cell, or core cell. The same single masking step also forms interconnections between multi-function logic cells, between multi-function logic cells and input/output buffer cells, and between input/output buffer cells and input/output chip pads.

According to the method of the present invention, higher density VLSI components are designed and fabricated by applying a single masking step to previously partially processed wafers, that is, to master slice wafers. Circuit macro functions such as NAND, AND, NOR, OR, XOR, ADDER, LATCHES, MULTIPLEXERS and DECODERS can be configured with one or more multi-function logic cells. The layout of a chip employing the method according to the present invention comprises multi-function logic cells arranged in rows and columns, and primary input/output buffer cells placed at the periphery of the chip. The components have various metal levels, or layers, with insulating layers positioned between the metal levels.

A first metal level is used for defining the personalities of the logic elements in the multi-function logic cells, of the input/output buffer cells, and of the power and ground buses to the cells. A second metal level, spaced from the first metal level by an insulating layer, is used for vertical wire segments, that is, wire segments extending in one direction in the plane of the second metal level. The second metal level is also used in completing the input/output buffer personalities and its own fixed power and ground buses. The complete layouts of the input/output buffers, the power and ground buses, and the input/output pad connections to the input/output buffers are predefined. A third metal level is spaced from the second metal level by an insulating layer. Master slice wafers defining the components are processed to the point of including a personalized second metal level, second metal level to third metal level vias, and second metal level to third metal level interconnection studs in the vias, as well as metal deposition for the third metal level. With the enhancements already made in the semiconductor metallization process, metal lines of less than 1.0 micron width, metal line to metal line spacing of less than 1.0 micron, and vertical stacked vias between metal layers are achievable.

According to the present invention, a master slice wafer is transformed into a gate array ASIC by personalizing the third metal level using a single masking step. With this single masking step, personalities of the functions of the multi-function logic cells are formed or established, and interconnections between multi-function logic cells, between multi-function logic cells and input/output buffer cells, from power ground buses to chip power and ground pads, and from input/output buffer cells to chip signal pads are all formed or established. Individual ASICs performing unique logic functions are processed with the single masking step using, from stock, wafers which were previously partially processed. The process according to the present invention provides very fast turn around time for producing desired ASIC components and limits the cost to only one mask and one masking step process. Final wafer test and packaging of the good ASIC chips are done in the normal present-day process steps.

DETAILED DESCRIPTION OF THE PREFERRED EMBODIMENT

Figure 1:
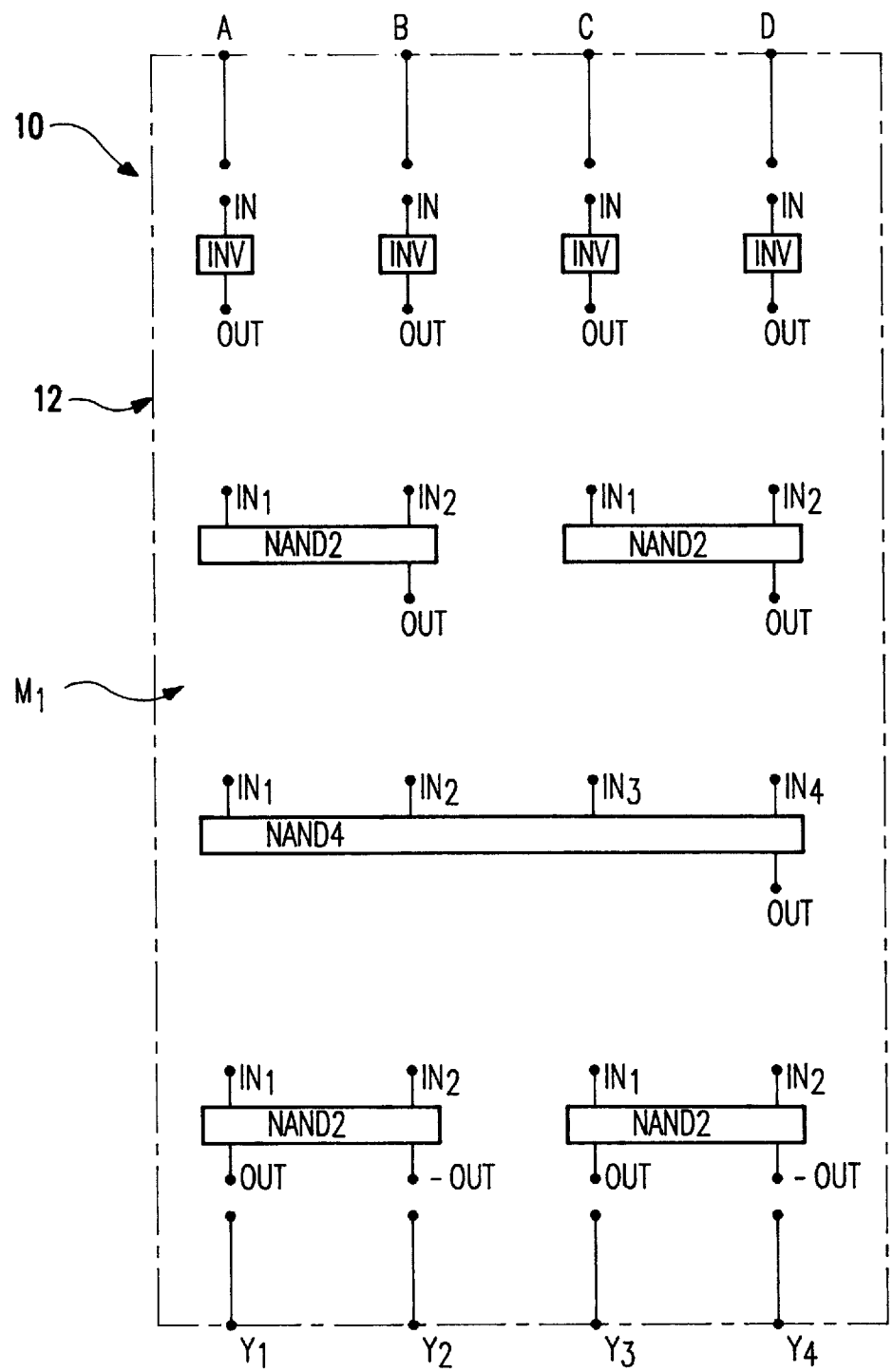
FIG. 1 is a schematic illustration of a first metal level of a multi-function logic cell of an ASIC according to the present invention, the first metal level defining logic elements.

As can be seen from FIG. 1, a multi-function logic cell, or core cell, for a component according to the present invention, which is designated generally by the reference numeral 10, has a first metal level $M_1$, comprising, for example, the following logic elements: 4 inverters, 2 NAND2's with NAND function outputs, 1 NAND4, and 2 NAND2's with NAND/AND function outputs. These logic elements are contained within a defined cell boundary 12. The primary inputs A, B, C and D, and outputs $Y_1$, $Y_2$, $Y_3$ and $Y_4$ are also provided on the multi-function logic cell 10. Core logic functions are associated with these inputs and outputs. Power and ground buses for the logic elements are also part of the multi-function logic cell 10. The personalities of the logic elements, that is, the interconnections between transistors to make up the functions of the individual logic elements, are designed using the first metal level $M_1$. Power and ground buses are also implemented at the metal level $M_1$.

Figure 2:
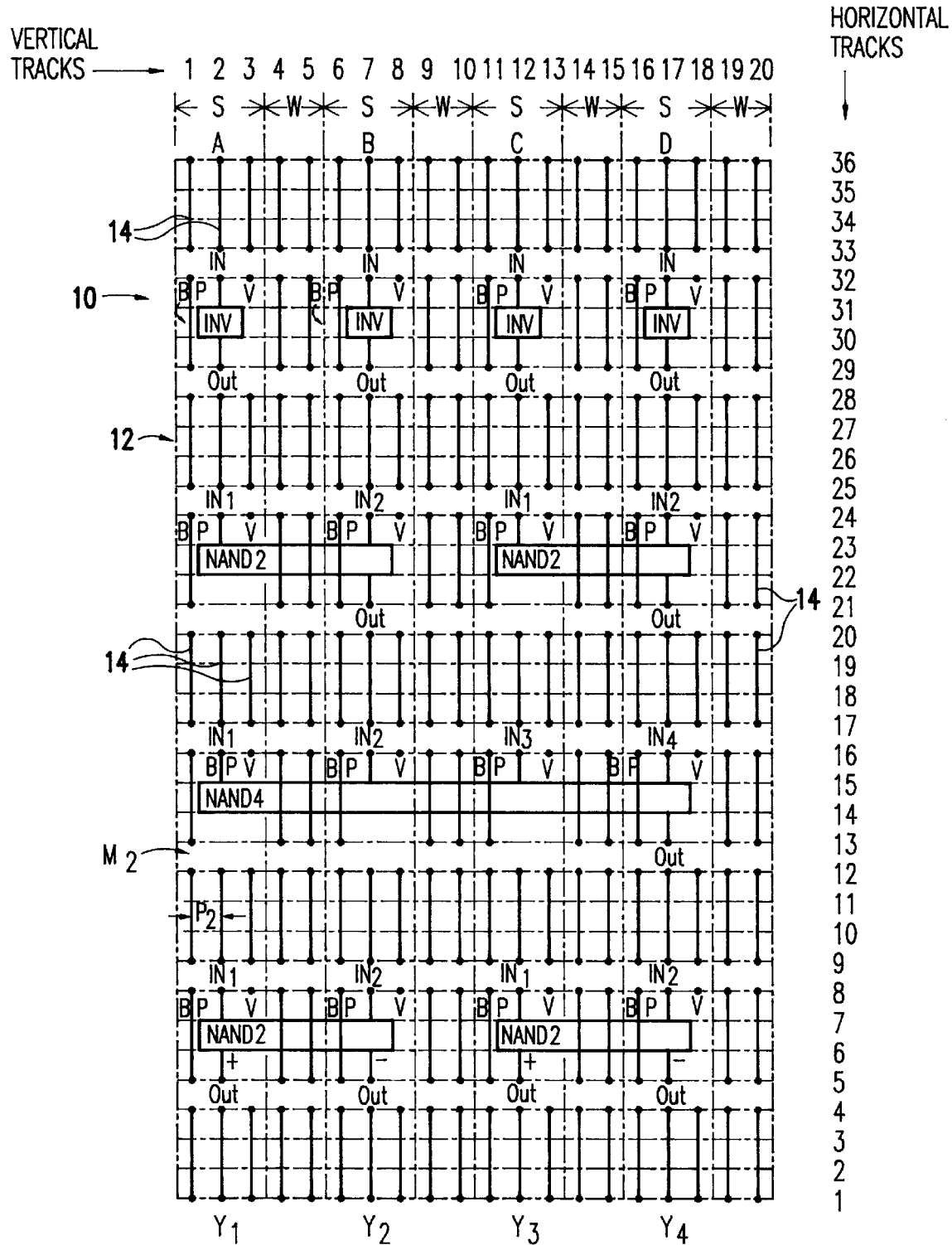
FIG. 2 is a schematic illustration of a second metal level of the multi-function logic cell of FIG. 1, shown superimposed over the logic elements of the first metal level.

The inputs and outputs of the logic elements of the $M_1$ level, which are shown in the background, are brought out through a second metal level $M_2$ to a third metal level $M_3$ as a part of a process forming the generic master slice wafer. In addition to the inputs and outputs, voltage tie up points V, which are used to tie up the unused inputs of the logic elements, are also brought up through the $M_2$ level to the $M_3$ level. By appropriate tie up, the NAND4 logic element can be used as a NAND3 or a NAND2 logic element. The multi-function logic cell 10 has a personalized array of vertical wire segments 14 over its entire area in a second metal level $M_2$, as is shown in FIG. 2, the $M_2$ wire segments 14 having a pitch $P_2$. The multi-function logic cell 10 is divided into eight parts marked as "S" and "W" at the top of FIG. 2. Most of the $M_2$ wire segments 14 in the "S" region are used for implementing higher level logic functions using the logic elements in the cell 10, whereas $M_2$ wire segments 14 in the "W" region are used for multi-function interconnections from the multi-function logic cell 10 to another logic cell, which is also known as global wiring of the ASIC chip. Unused $M_2$ wire segments 14 in the "S" regions can also be used for global wiring.

Figure 3:
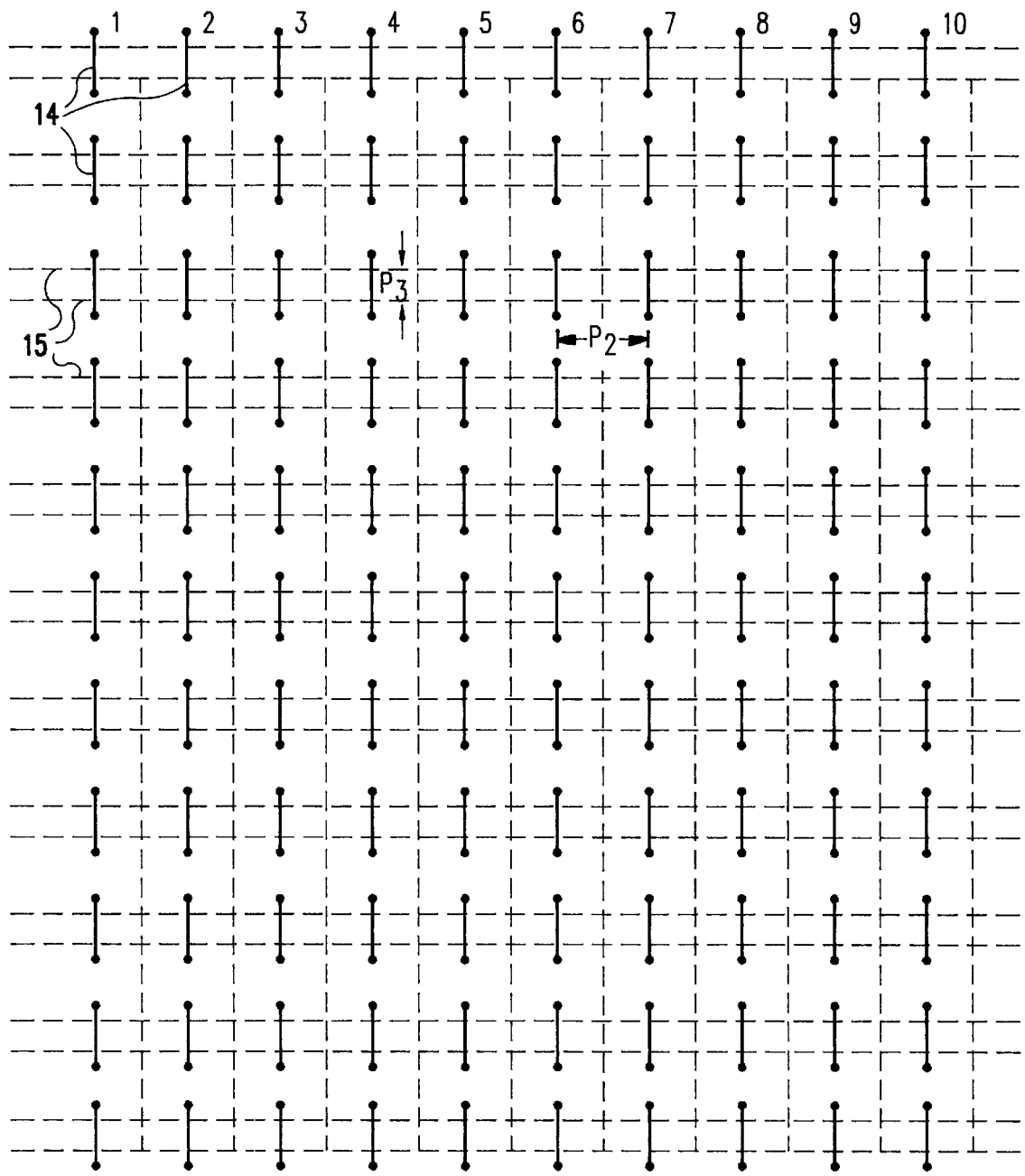
FIG. 3 is a schematic illustration of the positions in which any horizontal wires of a third metal level are to be formed relative to the vertical wire segments of the second metal level.
Figure 4:
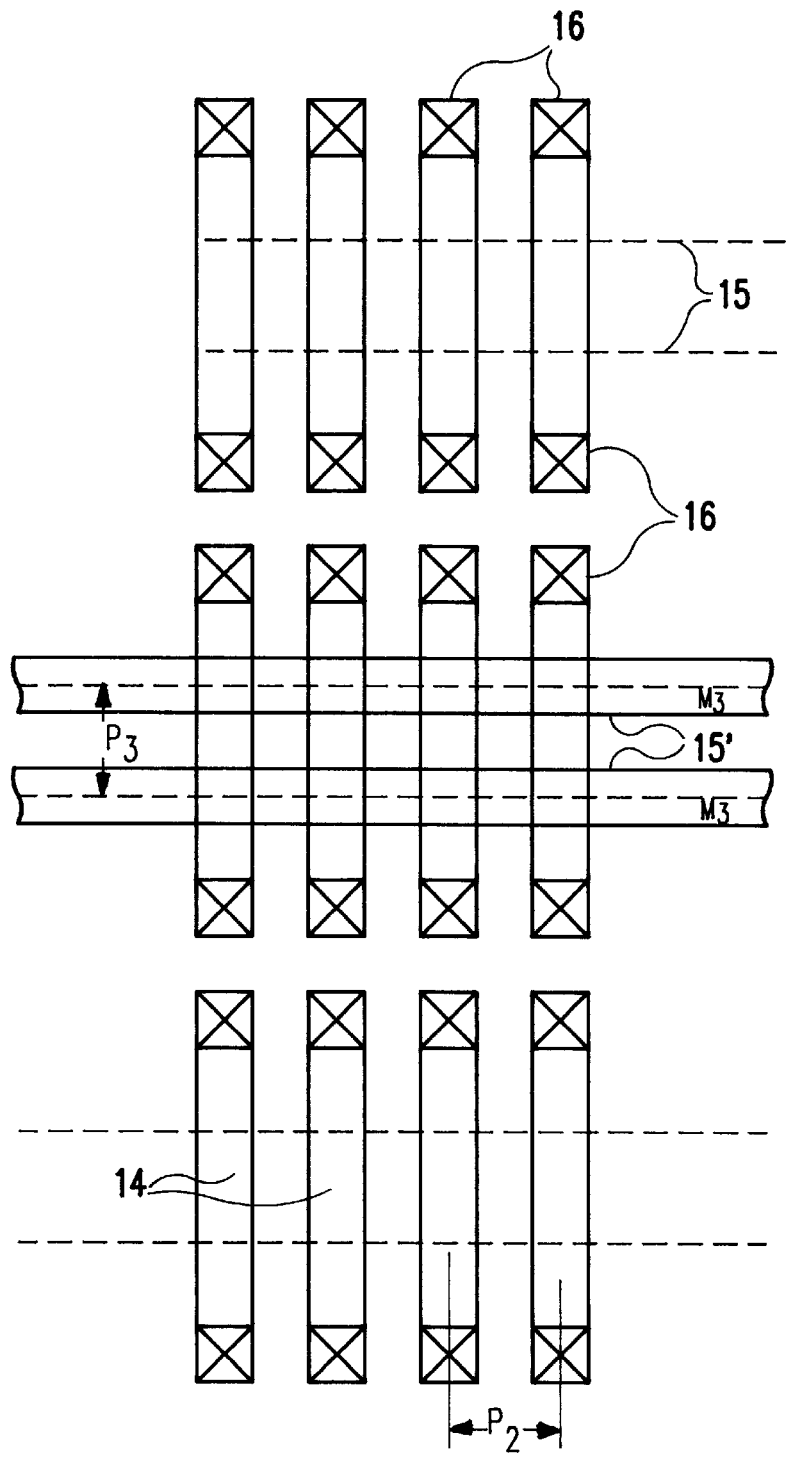
FIG. 4 is an enlarged view of some horizontal wires and the vertical wire segments of FIG. 3.

As can be seen from FIG. 3, the potential positions 15, or tracks, of horizontal wires 15' in a third metal level $M_3$ are superimposed over some of the vertical $M_2$ wire segments 14 in the second metal level $M_2$ of the multi-function logic cell 10, with an insulating layer (not shown) between the $M_2$ and $M_3$ metal levels. A further magnified view of the $M_2$ wire segments 14 and locations 15 of $M_3$ wires is shown in FIG. 4. The outlines of the two central $M_3$ wires 15' are shown, whereas the positions 15 indicate the positions of centerlines other $M_3$ wires which could be formed. The pitch of the wires 15' is indicated by $P_3$, and each $M_2$ wire segment 14 is three $P_3$ pitches high. As can be seen from FIGS. 2 and 7, the multi-function logic cell 10 is 36 $P_3$ pitches high and 20 $P_2$ pitches wide. Two horizontal $M_3$ wire positions 15 pass over each $M_2$ wire segment 14. Both ends of the $M_2$ wire segments 14 are brought up to the $M_3$ level with tungsten studs 16 in vias through the insulator layer between the $M_2$ and $M_3$ metal layers. The studs 16 already make contact with the metal deposited on the $M_3$ level in the partially processed master slice wafer. In order to connect an $M_2$ wire segment 14 to an $M_3$ wire 15' through a metal stud 16, a connecting vertical $M_3$ wire segment must be formed on the $M_3$ level. If the ends of an $M_2$ wire segment 14 are not to be connected, then there is no $M_3$ wire 15' or $M_3$ wire segment on the tops of the studs 16 which are connected to the ends of that $M_2$ wire segment.

ASIC cell library functions are implemented using the logic elements in the multifunction logic cell 10, from the simplest implementation of four inverter functions in a cell to more complex functions, such as XOR, XNOR, HALF ADDER, 2:1 SELECT or LATCH functions. Some of the core cell functions are: inverters; 2 to 4 NAND, AND with true or complement inputs; 2 to 4 NOR, OR with true or complement inputs; AND-OR; AND-OR-INVERT; OR-AND; OR-AND INVERT; 2:1 SELECT; 2:4 DECODE; XOR2; XNOR2; LATCH; and HALF ADDER. Variations of these functions with true or complement inputs, driving strengths, etc., can also be achieved from the logic elements of the cell 10.

Figure 5A:
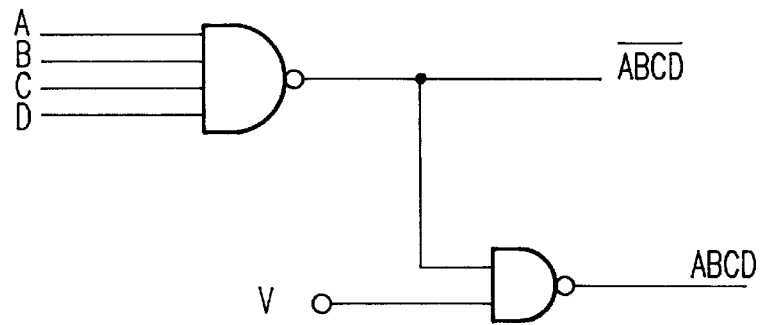
FIG. 5A is a schematic illustration of the implementation of NAND/AND functions using the multi-function logic cell of FIGS. 1–4.
Figure 5B:
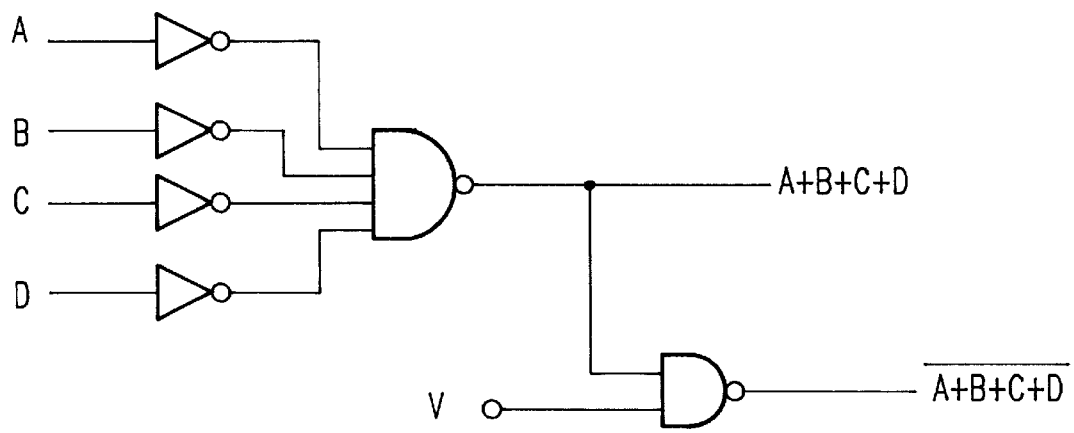
FIG. 5B is a schematic illustration of the implementation of OR/NOR functions using the multi-function logic cell of FIGS. 1–4.
Figure 5C:
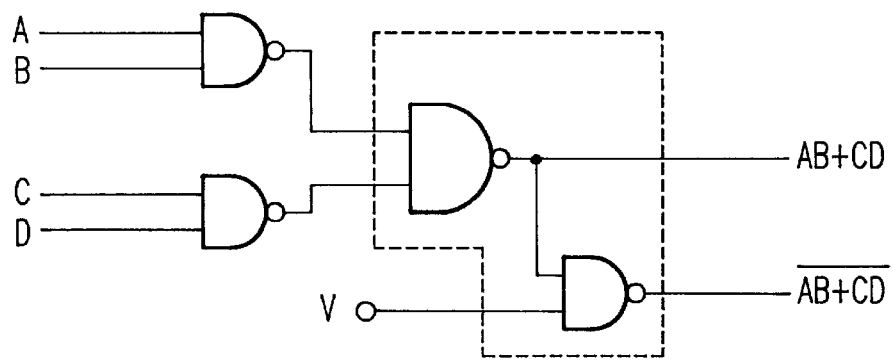
FIG. 5C is a schematic illustration of the implementation of AND-OR/AND-OR-INV functions using the multi-function logic cell of FIGS. 1–4.

Logic implementation of some of the core functions of the cell 10 is shown in FIGS. 5A, 5B and 5C. FIG. 5A shows how a NAND/AND function is implemented using the inputs A, B, C and D of the multi-function logic cell 10 and connecting them to the NAND4 gate to provide the function NOT ABCD ($\overline{ABCD}$). Furthermore, the output of the NAND4 gate is connected to the input of one of the NAND2 gates, with the other input of the NAND2 gate connected to a voltage tie up point V, to use the NAND2 gate as an inverter to provide the ABCD function.

FIG. 5B shows the implementation of the OR/NOR function using the cell 10. The inputs A, B, C and D of the cell 10 are each connected to the input of a respective one of the inverters, with the outputs of the inverters connected to inputs of the NAND4 gate to provide the function A+B+C+D. The output of the NAND4 gate is connected to the input of one of the NAND2 gates and the other input of the NAND2 gate is connected to one of the voltage tie up points V to provide the NOT A+B+C+D ($\overline{A+B+C+D}$) function.

FIG. 5C shows the implementation of the AND-OR/AND-OR-INV function using the cell 10. The inputs A, B, C and D are connected to the inputs of the 2 NAND2's with NAND function outputs. The outputs of these two NAND2 gates are connected to respective inputs of one of the NAND2 gates having NAND/AND function outputs to provide the AB+CD function and the NOT AB+CD ($\overline{AB+CD}$) function.

Figure 6:
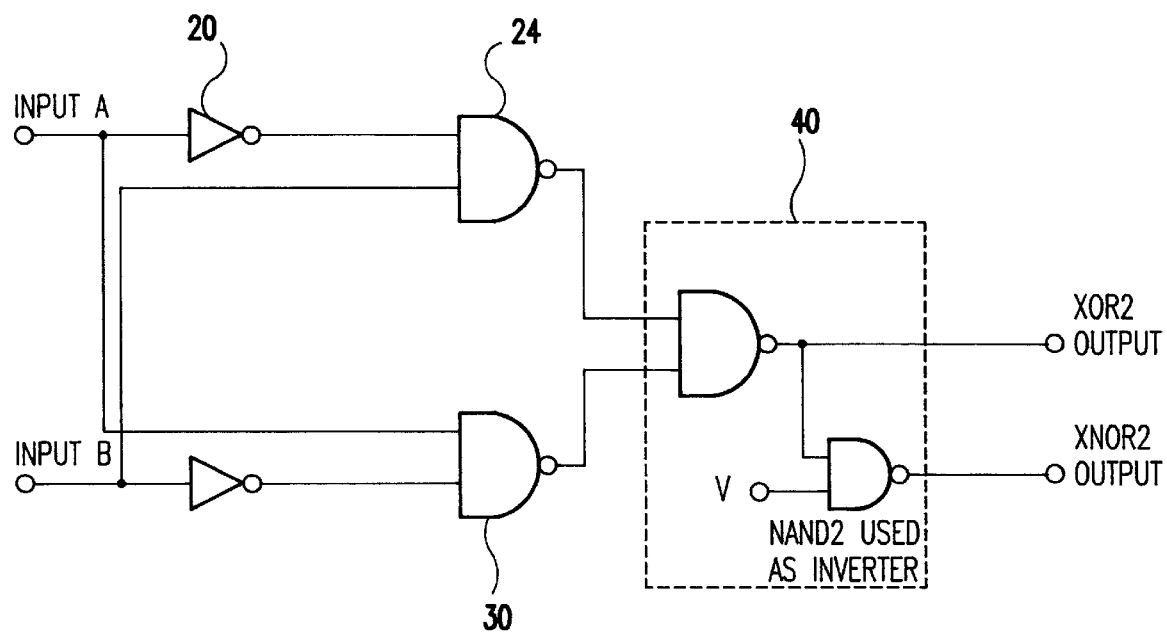
FIG. 6 is a schematic illustration of the implementation of XOR2/XNOR2 functions using the multi-function logic cell of FIGS. 1–4.
Figure 7:
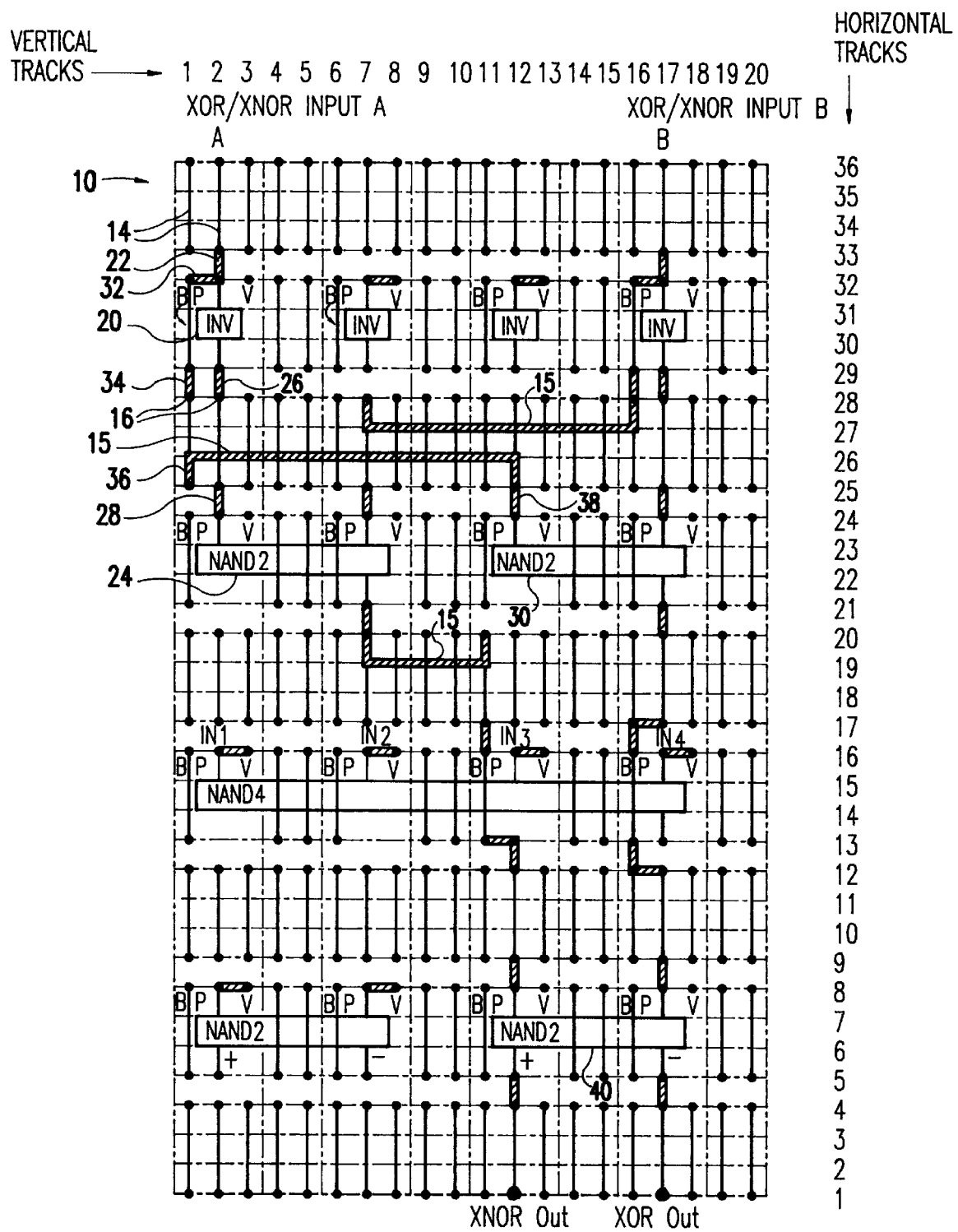
FIG. 7 is a schematic illustration of the multi-function logic cell of FIGS. 1–4, showing the personalizing connections on the third metal level for the XOR2/XNOR2 functions of FIG. 6.

Logic elements of the multi-function logic cell 10 can be used to implement the XOR, XNOR functions shown in FIG. 6. Two inverters, 2 NAND2's with NAND function outputs, and a NAND2 with NAND/AND function outputs are used to perform the function, and inputs of the other two inverters, the NAND4, and the unused NAND2 with NAND/AND function outputs are tied to "V". The interconnections between the elements of the cell 10 are illustrated in FIG. 7. All of the interconnections comprise $M_2$ wire segments 14, and M₃ wires 15', and wire segments formed on the M₃ level by the single masking step process. Each connection between an M₂ wire segment 14 and an M₃ wire 15' or wire segment is accomplished by one of the studs 16 extending through a via between the M₂ and M₃ levels. Except for the desired M₃ wires 15' and wire segments, the metal of the third metal level M₃ is removed.

The input A of the cell 10 is connected to the input of an inverter 20 by an M₂ wire segment 14 and an M₃ wire segment 22. The output of the inverter 20 is connected to an input of a first NAND2 element 24 by M₃ wire segments 26 and 28 and an M₂ wire segment 14. The input A is also connected to an input of a second NAND2 element 30 through a bypass around the inverter 20 by an M₃ wire segment 32 from the input of the inverter 20, an M₂ wire segment 14, an M₃ wire segment 34, another M₂ wire segment 14, an M₃ wire segment 36, an M₃ wire 15, and an M₃ wire segment 38. The other connections in the cell 10 shown in FIG. 7 are made in a similar manner, the connections corresponding to those shown in FIG. 6. A NAND2 40, which has NAND/AND function outputs, is indicated by the box shown in broken lines in FIG. 6. As can be seen from FIG. 7, horizontal tracks 2, 3, 6, 7, 10, 11, 14, 15, 18, 22, 23, 30, 31, 34 and 35 are not used in the XOR and XNOR function personality and can be used for cell-to-cell wiring the multi-function logic cell 10 to other cells. Other partially used tracks can also be used for wiring. Vertical tracks 4, 5, 9, 10, 14, 15, 19, 20 are free for cell-to-cell wiring. Other partially used vertical tracks can also be used for cell-to-cell wiring.

Complete cell library personalities of all multi-function logic cells 10 are created and stored in a technical file, just as with a conventional ASIC library. Rules showing available and blocked wiring tracks through the cells are also stored in the ASIC technology file for ASIC chip physical design.

Figure 8:
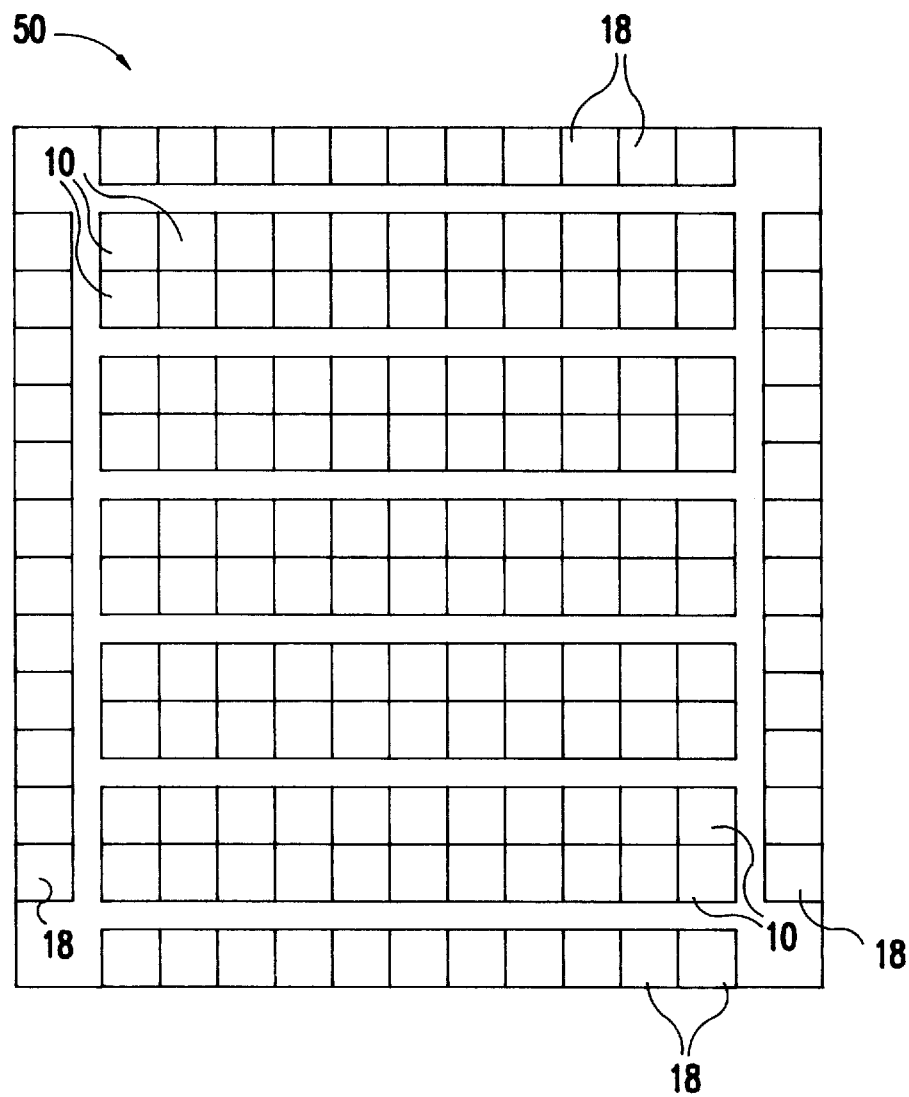
FIG. 8 is a schematic illustration of a chip image layout, showing the positions of multi-function logic cells, input and out buffer cells, and chip pads.

As can be seen from FIG. 8, input and output buffer cells 18 are placed on the periphery of a chip 50. The elements in the cells 18 are designed in such a way that any cell 18 can be used to perform the function of a receiver or driver or a bidirectional receiver/driver. The implementation of these functions is achieved by completing the cell internal interconnections with the single and final masking step which completes the connections within the multi-function logic cells 10. The cells 10 are laid out in rows and columns and are spaced from the edges of the chip 50. The internal interconnections within the input and output buffer cells 18 are completed in a manner similar to that used to complete the internal interconnections within the multi-function logic cells 10.

Figure 9:
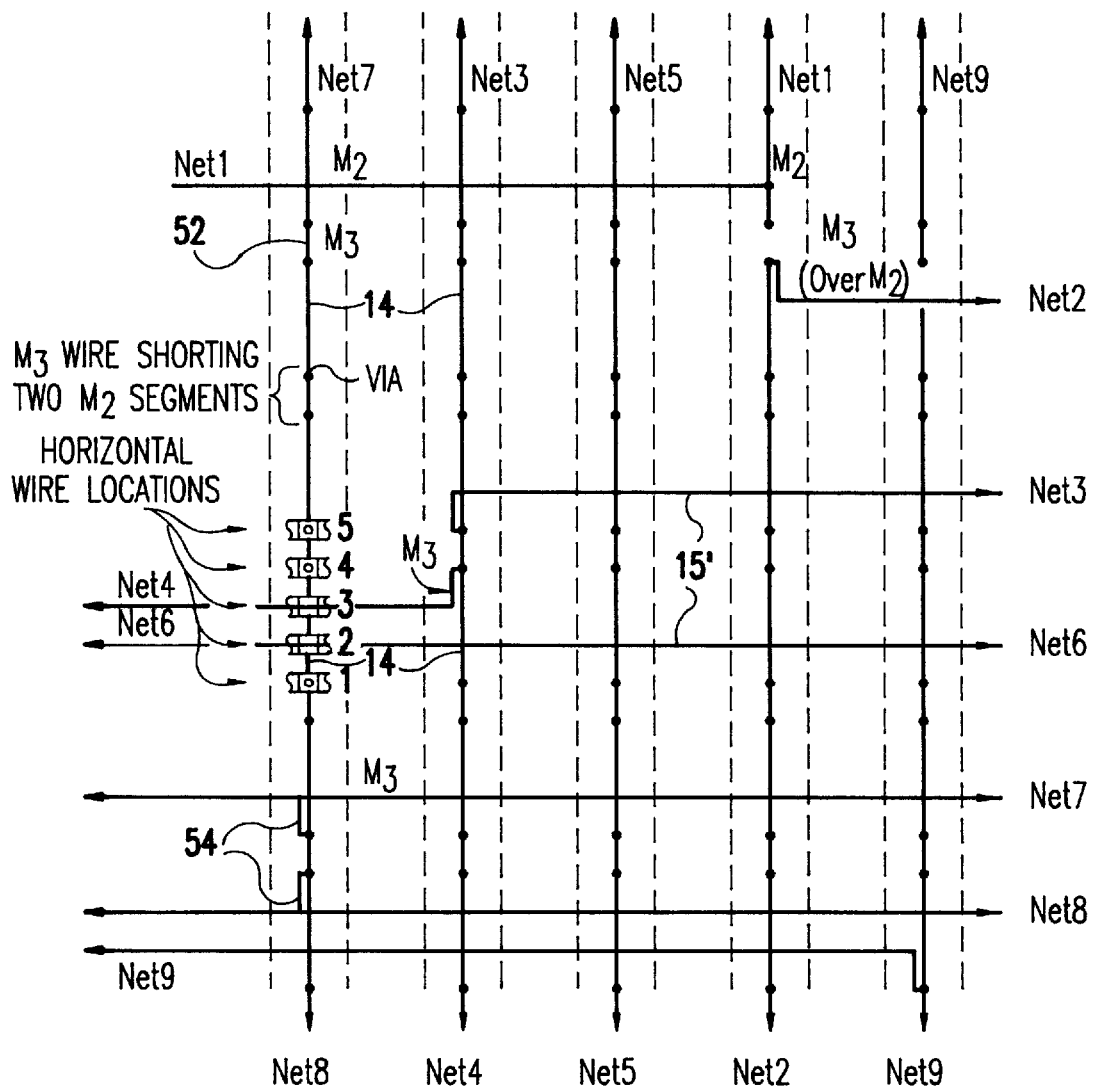
FIG. 9 is a schematic illustration of an example of global wiring on a multi-function logic cell according to the present invention.

With the objective of completing the ASIC design with a single masking step, a method to implement the cell-to-cell wiring is described below:

An array of M₂ wire segments 14 over the complete ASIC chip 50 is achieved when multi-function logic cells 10 are placed next to each other in rows and columns as shown in FIG. 8. The possibilities for connecting multi-function logic cells 10 to other cells can be appreciated from FIG. 9. Using the M₂ wire segments 14 and the metal studs 16 on both ends of the wire segments, the ASIC wiring is completed with personalized M₃ metal with only one mask per unique ASIC design. It can be seen from the example of FIG. 9, in which only the center lines of the M₂ wire segments 14 and the M₃ wires 15' are shown, that global wires can be routed in any possible direction. For example, a long vertical wire is constructed by shorting M₂ wire segments 14 with an M₃ wire segment 52. M₃ wire segments 54 start at ends of the M₂ segments 14 and go up or down one pitch P₃ to an M₃ wire 15', which goes horizontally. The M₃ wires 15' and wire segments 52, 54 are in a plane above the M₂ wire segments 14 and are formed with the personalizing single masking process step.

It will be apparent to those skilled in the art and it is contemplated that variations and/or changes in the embodiments illustrated and described herein may be made without departure from the present invention. Accordingly, it is intended that the foregoing description is illustrative only, not limiting, and that the true spirit and scope of the present invention will be determined by the appended claims.

We claim:

1. A method of making gate array ASIC components from a wafer having a first conducting layer interconnecting logic elements formed on the wafer and second and third conducting layers, wherein each said logic element is capable of performing a logic function, said first, second and third conducting layers being insulated from one another by insulating layers, and said second conducting layer containing first electrically conducting elements extending in a first direction, said second conducting layer being the same for all ASIC designs, comprising interconnecting at least some of the logic elements to one another with a single masking process step to complete an ASIC design by defining on said third conducting layer at least one second conducting element connected to at least one of said first electrically conducting elements formed in said second conducting layer to define connections between the logic elements.

2. The method of claim 1, wherein first electrically conducting elements each comprise a plurality of colinear segments spaced from one another.

3. The method of claim 2, wherein the logic elements of said wafer have inputs and outputs with leads extending up to said third conducting layer.

4. The method of claim 3, wherein conducting stud members extend from the ends of the segments of the first electrically conducting element of said wafer up to said third conducting layer, and the second conducting element is defined connected to at least one of said conducting stud members.

5. The method of claim 4, wherein a plurality of second conducting elements are defined in said wafer.

6. The method of claim 1, wherein the wafer comprises a plurality of chips each having a plurality of multi-function logic cells coplanar with one another, each multi-function logic cell containing a plurality of the logic elements and a plurality of the first electrically conducting elements, and the step of interconnecting comprises defining additional second conducting elements on said third conducting layer to complete connections between multi-function logic cells.

7. The method of claim 1, wherein at least a portion of said second conducting element extends in a second direction transverse to the first direction in which said first electrically conducting elements extend.

8. The method of claim 7, wherein said plurality extends over generally all of said ASIC component.

9. A method of making gate array ASIC components from a wafer having a first conducting layer interconnecting logic elements formed on the wafer and second and third conducting layers, said first, second and third conducting layers being insulated from one another by insulating layers, and said second conducting layer containing first electrically conducting elements extending in a first direction, said second conducting layer being the same for all ASIC designs, wherein said first electrically conducting elements are unconnected to said logic elements, comprising interconnecting at least some of the logic elements to one another with a single masking process step to complete an ASIC design by defining on said third conducting layer at least one second conducting element connected to at least one of said first electrically conducting elements formed in said second conducting layer to define connections between the logic elements.

10. The method of claim 9, wherein first electrically conducting elements each comprise a plurality of colinear segments spaced from one another.

11. The method of claim 10, wherein the logic elements of said wafer have inputs and outputs with leads extending up to said third conducting layer.

12. The method of claim 11, wherein conducting stud members extend from the ends of the segments of the first electrically conducting element of said wafer up to said third conducting layer, and the second conducting element is defined connected to at least one of said conducting stud members.

13. The method of claim 12, wherein a plurality of second conducting elements are defined in said wafer.

14. The method of claim 9, wherein the wafer comprises a plurality of chips each having a plurality of multi-function logic cells coplanar with one another, each multi-function logic cell containing a plurality of the logic elements and a plurality of the first electrically conducting elements, and the step of interconnecting comprises defining additional second conducting elements on said third conducting layer to complete connections between multi-function logic cells.

15. The method of claim 9, wherein at least a portion of said second conducting element extends in a second direction transverse to the first direction in which said first electrically conducting elements extend.

16. The method of claim 15, wherein said plurality extends over generally all of said ASIC component.

* * * * *